(12) United States Patent
Wang

(10) Patent No.: US 8,535,003 B2
(45) Date of Patent: Sep. 17, 2013

(54) FAN FRAME AND HEAT DISSIPATION APPARATUS USING THE SAME

(75) Inventor: Wei-Jun Wang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 558 days.

(21) Appl. No.: 12/884,449

(22) Filed: Sep. 17, 2010

(65) Prior Publication Data
US 2011/0158801 A1 Jun. 30, 2011

(30) Foreign Application Priority Data
Dec. 25, 2009 (CN) .......................... 2009 1 0312308

(51) Int. Cl.
*F01D 25/26* (2006.01)
(52) U.S. Cl.
USPC .................. 415/213.1; 415/214.1; 416/244 R
(58) Field of Classification Search
USPC .................. 361/679.48, 679.49, 679.58, 690, 361/695, 704, 727; 415/126, 128, 213.1, 415/214.1, 220; 416/224 R, 246
See application file for complete search history.

(56) References Cited

U.S. PATENT DOCUMENTS 5,788,566 A * 8/1998 McAnally et al. ............. 454/184
6,817,939 B2 * 11/2004 Gan et al. ...................... 454/184

* cited by examiner

*Primary Examiner* — Edward Look
*Assistant Examiner* — Jason Davis
(74) *Attorney, Agent, or Firm* — Altis Law Group, Inc.

(57) ABSTRACT

A fan frame for a heat dissipation apparatus is provided. The fan frame includes an outer frame, an inner frame sleeved in the outer frame and slidable relative to the outer frame, a latching mechanism for mechanically securing the inner frame to the outer frame. The latching mechanism includes one or more resilient latches, one or more receiving portions capable of receiving the resilient latches in a first latched position and a second latched position, and an actuator mechanism connected to the outer frame and capable of resisting the resilient latch to cause elastic deformation of the resilient latch, thereby withdrawing the resilient latch from the receiving portion.

20 Claims, 5 Drawing Sheets

FAN FRAME AND HEAT DISSIPATION APPARATUS USING THE SAME

BACKGROUND

1. Technical Field

The present disclosure generally relates to a fan frame and a heat dissipation apparatus employing the fan frame.

2. Description of the Related Art

As technology continues to advance, it is inevitable that electronic components such as integrated circuits (ICs) will incorporate even larger numbers of transistors and other such components in their construction, and accordingly, these ICs will emit even more heat than before. Thus, achieving a requisite level of heat dissipation in electronic components has become an obstacle affecting their further development.

In order to minimize the effect of high temperatures resulting from the operation of the electronic components, heat dissipation apparatuses are often used. A conventional heat dissipation apparatus generally includes a fan frame with a fan mounted thereon. The fan frame includes an outer frame and an inner frame received in the outer frame. A plurality of electronic components, such as a display card or a plurality of memory banks/cards are received in the inner frame. The fan dissipates heat generated by the electronic components. However, the inner frame is fixed to the outer frame by a plurality of screws. During the assembly of the electronic components, the inner frame is moved relative to the outer frame to a first predetermined position to allow the assembly of the electronic components, and the inner frame is fixed to the outer frame by means of the screws. After the electronic components are assembled, the screws are removed and the inner frame is reassembled to the outer frame via the screws, and the inner frame is retained in a second position adjacent to or contacting the electronic components. As a result, the usage of the fan frame may be bothersome.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION OF THE EMBODIMENTS

Figure 1:
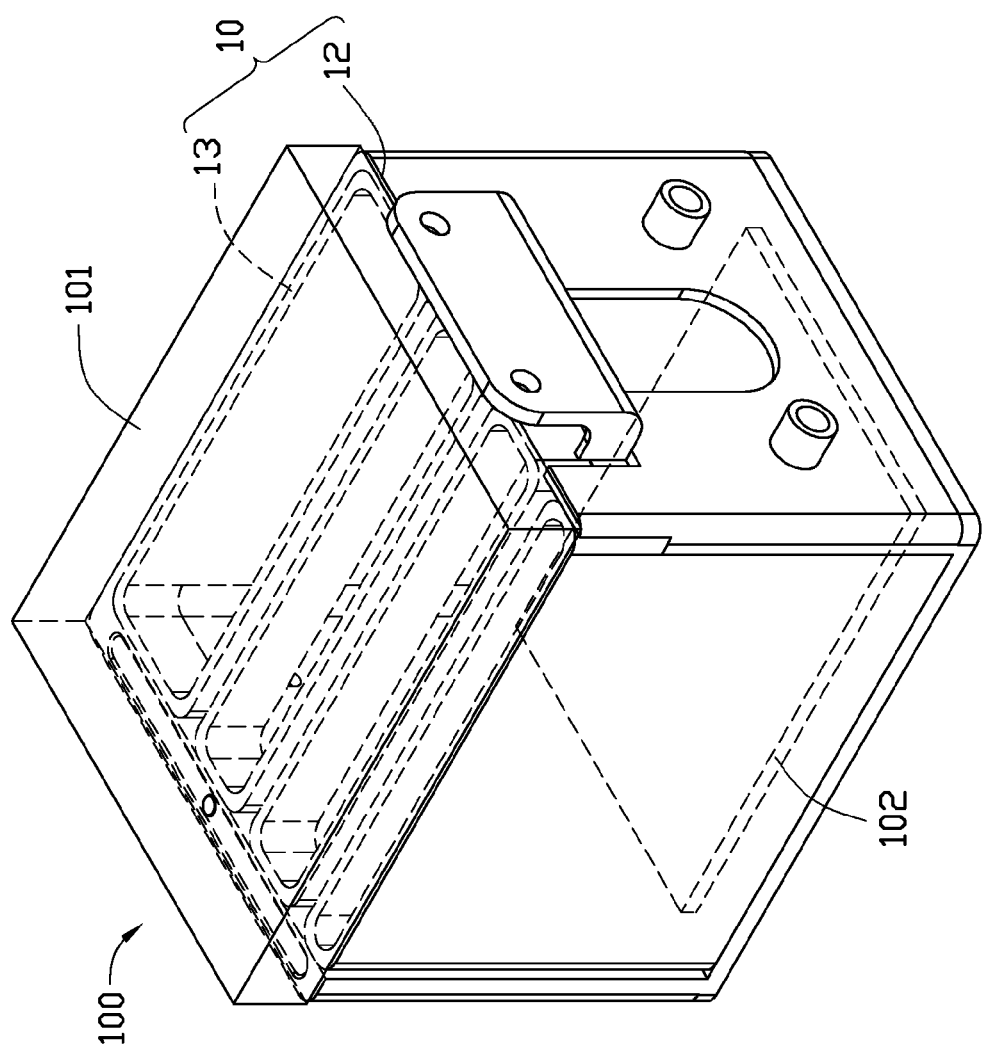
FIG. 1 is an assembled, isometric view of one embodiment of a heat dissipation apparatus including a fan frame with a fan mounted thereon.

Referring to FIG. 1, one embodiment of a heat dissipation apparatus 100 can be used with a desktop computer (not shown). The heat dissipation apparatus 100 includes a fan frame 10 and a fan 101 mounted on the top of the fan frame 10. A plurality of electronic components 102 is received in the fan frame 10, and the fan 101 is operable to dissipate heat generated by the operation of the electronic components 102.

Figure 2:
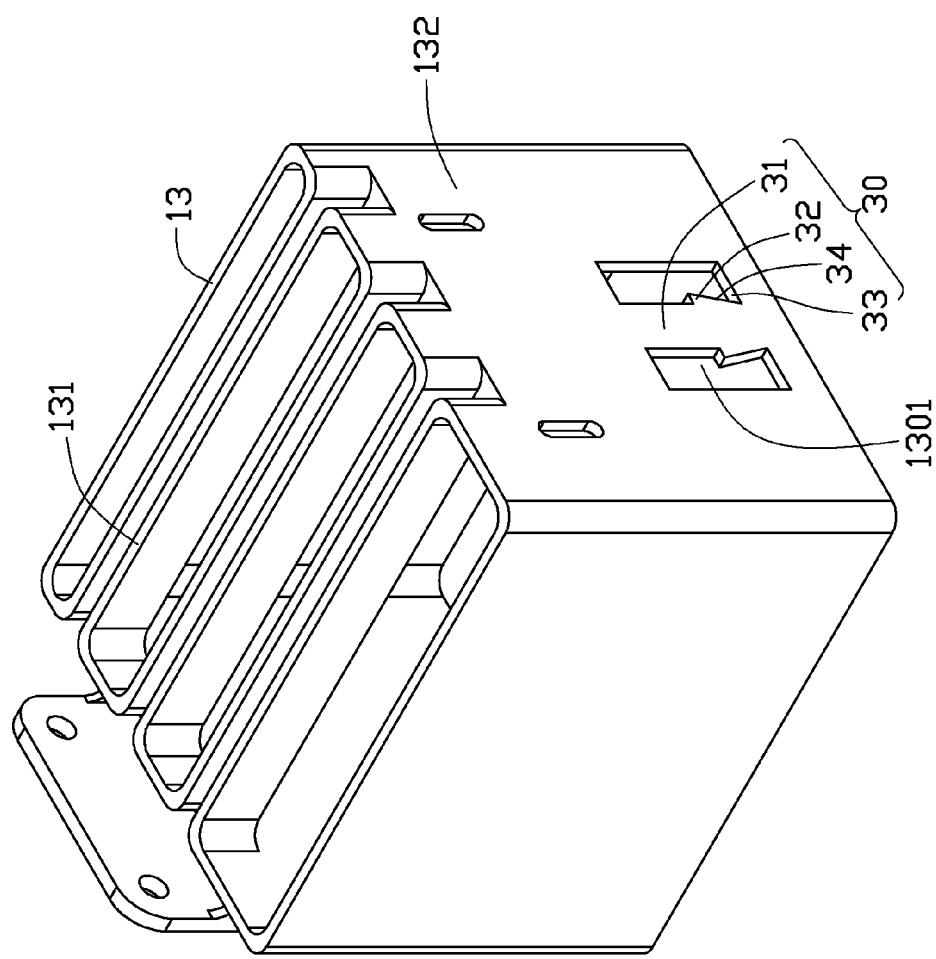
FIG. 2 is an isometric view of an inner frame of one embodiment of a fan frame employed by a heat dissipation apparatus such as, for example, the heat dissipation apparatus of FIG. 1.
Figure 3:
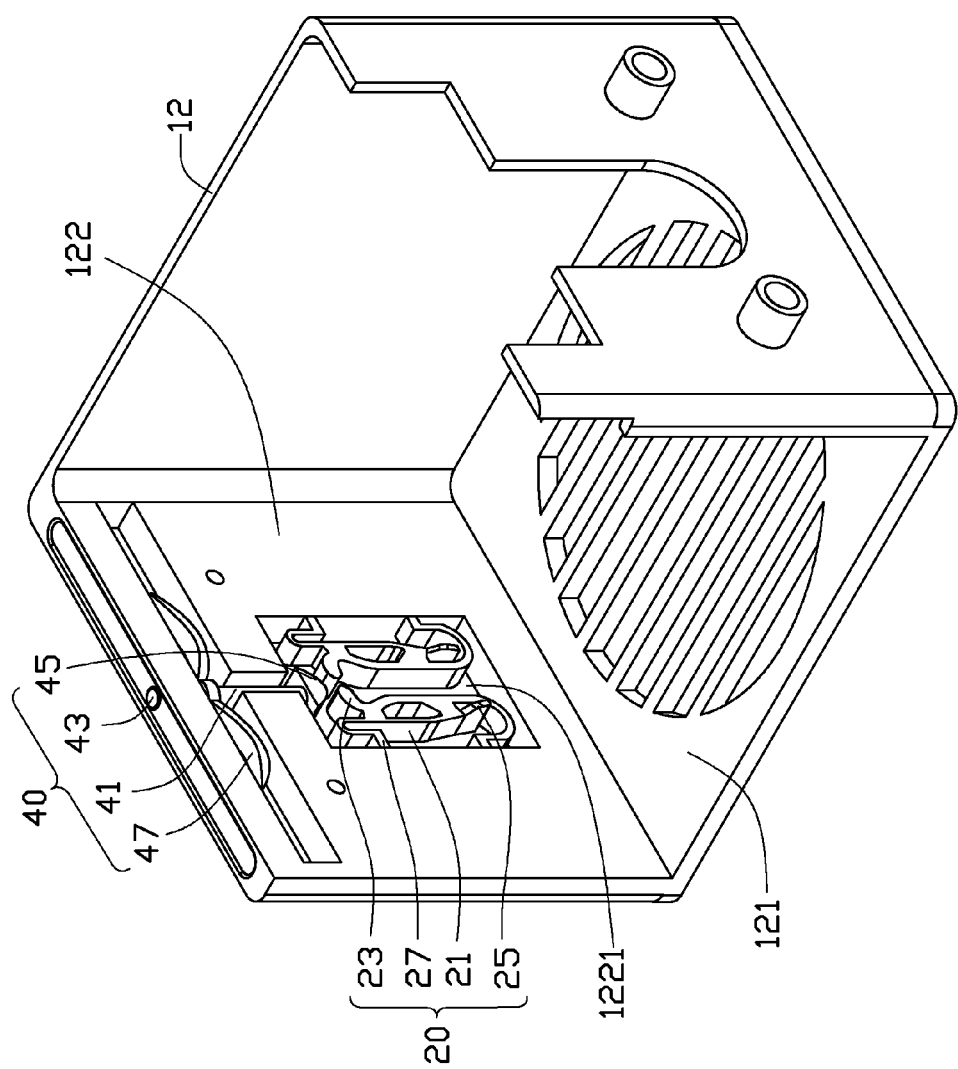
FIG. 3 is an isometric view of an outer frame of one embodiment of the fan frame of FIG. 2.

Referring also to FIGS. 2 and 3, the fan frame 10 includes an outer frame 12, an inner frame 13 sleeved in the outer frame 12 and slidable relative to the outer frame 12, a latching mechanism (not labeled) for mechanically securing the inner frame 13 to the outer frame 12, and an actuator mechanism 40.

In one embodiment, the latching mechanism includes a pair of resilient latches 20 fixed to the outer frame 12, and a pair of receiving portions 30 fixed to the inner frame 13 to receive and engage the resilient latches 20 in a first latched position and a second latched position. The resilient latches 20 are movable toward each other, and are also opposite to each other and adjacent to the receiving portions 30. The actuator mechanism 40 is mounted to the outer frame 12 for resisting and elastically deforming the resilient latches 20 to unlatch the resilient latches 20 from the receiving portions 30 accordingly.

The outer frame 12 includes a bottom surface 121 and three sidewalls 122 extending from the bottom surface 121. The electronic components 102 are mounted on the bottom surface 121 and received in the outer frame 12. One sidewall 122 defines a first receiving groove 1221 in which the resilient latches 20 are received. In this illustrated embodiment, the resilient latches 20 and the outer frame 12 are integrally formed.

Each resilient latch 20 includes a main annular body 21. A contact portion 23 is formed on the top of the main annular body 21 to contact the actuator mechanism 40. A latch portion 25 is formed on the bottom of the main annular body 21 for engaging one receiving portion 30. The main annular body 21 is resiliently connected to the outer frame 12 via a curved upper connecting portion 27 and a curved lower connecting portion 29. The upper and lower connecting portions 27 and 29 are positioned on opposite ends of the main annular body 21. When the contact portion 23 is pressed, the upper and lower connecting portions 27 and 29 are resiliently deformed, thereby causing the opposite latch portions 25 to separate from each other, and to withdraw the resilient latches 20 from the receiving portions 30.

The inner frame 13 includes an upper surface 131 on which the fan 101 is mounted, and four sidewalls 132 extending from the upper surface 131. One sidewall 132 defines a second receiving groove 1301. The receiving portions 30 are integrally formed with the inner frame 13 and received in the second receiving groove 1301.

Each receiving portion 30 includes a longitudinal main body 31, a first receiving portion 32 protruding from the main body 31, a second receiving portion 33 recessed in the main body 31, and a connecting surface 34 connecting the first and second receiving portions 32 and 33. The connecting surface 34 is disposed at an angle toward the main body 31.

Figure 4:
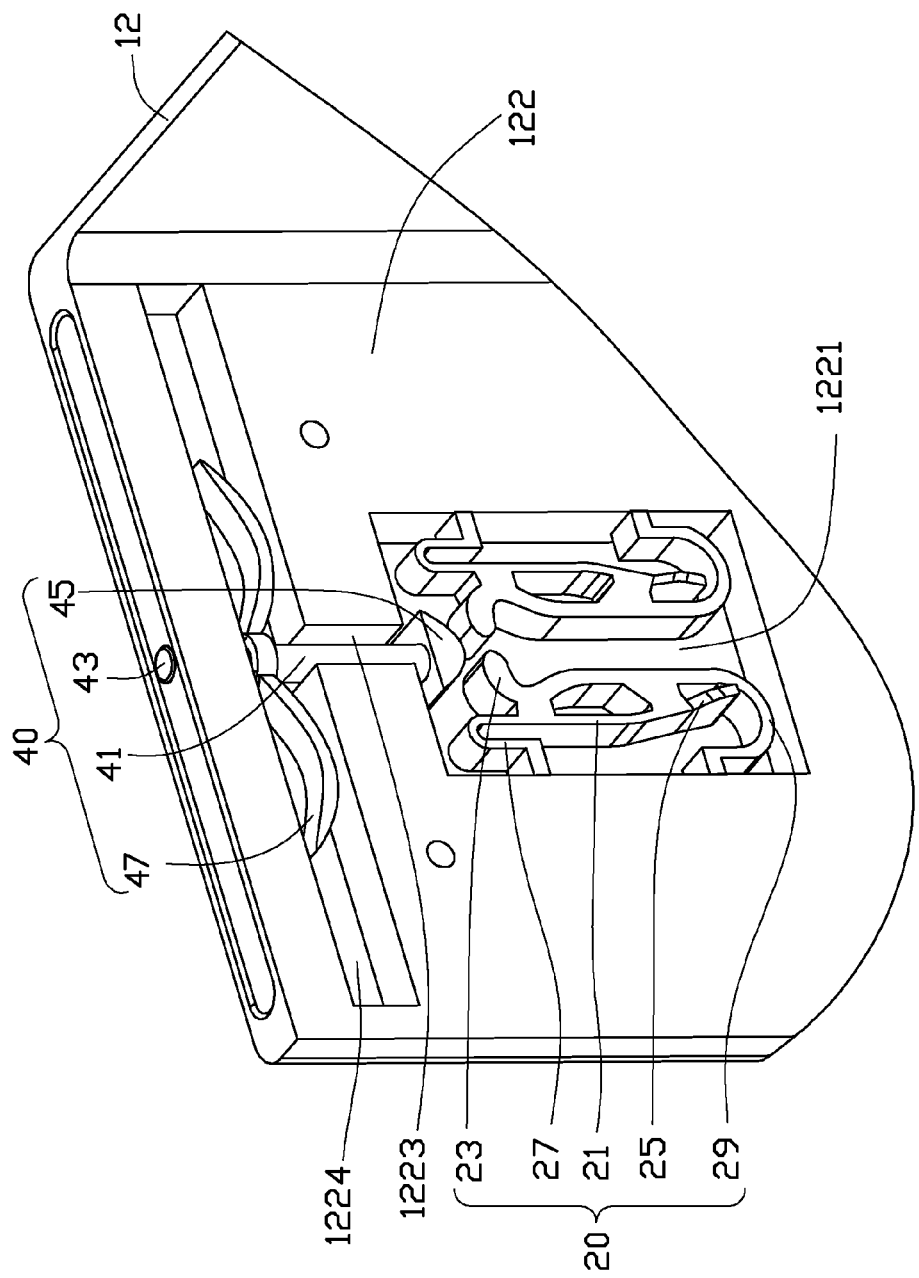
FIG. 4 is a partial, enlarged view of the fan frame of FIG. 3, showing a resilient latch and an actuator mechanism.
Figure 5:
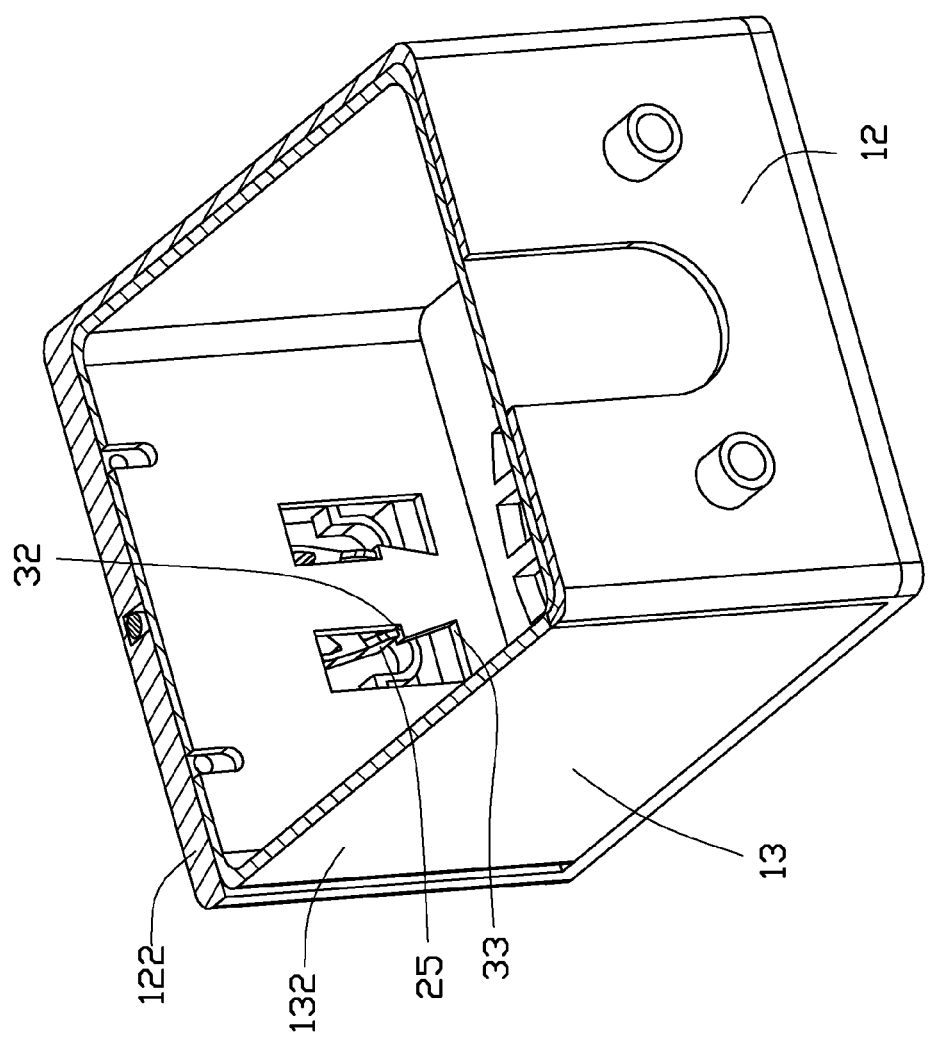
FIG. 5 is a cross section of the fan frame of FIG. 2 with an inner frame in a first latched position.

Referring to FIG. 4, in one embodiment, the actuator mechanism 40 includes an operating post 41 slidably mounted in the outer frame 12, a button end 43 formed on one end of the operating post 41, a contact end 45 opposite to the button end 43 for contacting the resilient latches 20, and a pair of resilient reset portions 47 exerting a biasing force on the outer frame 12 to retract the operating post 41. The reset portions 47 are located on opposite sides of the operating post 41, respectively.

The sidewall 122 in which the resilient latches 20 are formed defines a first assembly groove 1223 and a second assembly groove 1224. The first assembly groove 1223 communicates with the first receiving groove 1221, and the second assembly groove 1224 is substantially perpendicular to the first assembly groove 1223. The operating post 41 is slidably received in the first assembly groove 1223 with the button end 43 extending out of the outer frame 12 and the contact end 45 extending into the first receiving groove 1221. The resilient reset portions 47 are substantially arcuated and received in the second assembly groove 1224 with its two ends and middle portion resisting the outer frame 12. In another embodiment, the reset portions 47 can be a plurality of springs.

Referring to FIGS. 2 through 5, during use, the inner frame 13 is received in the outer frame 12, and the sidewalls 122 of the outer frame 12 contact the sidewalls 132 of the inner frame 13. When the inner frame 13 is moved downward to the first latched position where a larger distance exits between the bottom of the inner frame 13 and the bottom surface 121 of the outer frame 12, the latch portion 25 is received in the first receiving portion 32, and retains the inner frame 13 in the first latched position where sufficient space is provided to facilitate the disassembly or assembly of the electronic components 102.

When the button end 43 is pressed, the contact end 45 resists the contact portions 23 of the resilient latches 20 to deform the resilient latches 20, and the resilient latches 20 are unlatched from the first receiving portions 32. As the inner frame 13 further moves downward along the connecting surface 34 to the second latched position where a shorter distance exists between the bottom of the inner frame 13 and the bottom surface 121 of the outer frame 12, the latch portions 25 are received in the second receiving portions 33, and retains the inner frame 13 in the second latched position where the inner frame 13 is adjacent to or contacting the electronic components 102. When the button end 43 is released, the operating post 41 is retracted via the resilient reset portions 47. To move the inner frame 12 from the second latched position to the first latched portion, the inner frame 13 is drawn out from the outer frame 12, and the resilient latch 20 slides upward along the connecting surface 34 until the latch portion 25 is moved to the first latched position and received in the first receiving portion 32.

While the disclosure has been described in terms of several preferred embodiments, there are alternative permutations, and equivalents, which fall with the scope of this invention. For example, the location of the resilient latches and the receiving portions may be reversed such that the receiving portion is located in the outer frame, and the resilient latches are located in the inner frame. Furthermore, a plurality of latching mechanisms may be used in the fan frame.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A fan frame for a heat dissipation apparatus, the fan frame comprising:
    an outer frame;
    an inner frame sleeved in the outer frame and slidable relative to the outer frame;
    a latching mechanism for mechanically securing the inner frame to the outer frame, the latching mechanism comprising:
    a resilient latch;
    a receiving portion capable of receiving the resilient latch in a first latched position and a second latched position; and
    an actuator mechanism connected to the outer frame and capable of resisting the resilient latch to cause elastic deformation of the resilient latch, thereby withdrawing the resilient latch from the receiving portion.

2. The fan frame for a heat dissipation apparatus of claim 1, wherein the outer frame comprises a bottom surface and a plurality of sidewalls extending from the bottom surface, and the resilient latch is fixed to one of the sidewalls.

3. The fan frame for a heat dissipation apparatus of claim 2, wherein one of the plurality of sidewalls defines a first receiving groove, and the resilient latch is integrally formed with the outer frame and received in the first receiving groove.

4. The fan frame for a heat dissipation apparatus of claim 3, wherein the resilient latch comprises a main annular body, at least one resilient connecting portion formed on the main annular body and connected to the sidewall, and a latch portion for receiving the receiving portion.

5. The fan frame for a heat dissipation apparatus of claim 4, wherein the at least one resilient connecting portion comprises a curved upper connecting portion and a curved lower connecting portion on opposite ends of the main annular body.

6. The fan frame for a heat dissipation apparatus of claim 4, wherein the resilient latch further comprises a contact portion formed on the main annular body for contacting the actuator mechanism.

7. The fan frame for a heat dissipation apparatus of claim 1, wherein the inner frame defines a second receiving groove, and the portion receiving portion is integrally formed with the inner frame and received in the portion receiving groove.

8. The fan frame for a heat dissipation apparatus of claim 7, wherein the receiving portion comprises a longitudinal main body, a first receiving portion protruding from the main body corresponding to the first latched position, a second receiving portion recessed into the main body corresponding to the second latched position, and a connecting surface connecting the first and second receiving portions.

9. The fan frame for a heat dissipation apparatus of claim 1, wherein the actuator mechanism comprises an operating post slidably mounted in the outer frame, a button end formed on one end of the operating post, a contact end opposite to the button end for contacting the resilient latch, and a resilient reset portion biasing the operating post.

10. The fan frame for a heat dissipation apparatus of claim 9, wherein the outer frame defines an assembly groove, in which the resilient reset portion is received and resists the outer frame.

11. The fan frame for a heat dissipation apparatus of claim 10, wherein the resilient reset portion is arcuated.

12. A fan frame for a heat dissipation apparatus, the fan frame comprising:
    an outer frame;
    an inner frame sleeved in the outer frame and slidable relative to the outer frame;
    a latching mechanism for mechanically securing the inner frame to the outer frame, the latching mechanism comprising:
    a pair of resilient latches facing each other and integrally formed with the outer frame;
    a pair of receiving portions opposite to each other and integrally formed with the inner frame, the pair of receiving portions capable of receiving the corresponding resilient latches in a first latched position and a second latched position; and
    an actuator mechanism connected to the outer frame and capable of resisting the resilient latches to generate elastic deformation of the resilient latches, thereby withdrawing the resilient latches from the corresponding receiving portions.

13. The fan frame for a heat dissipation apparatus of claim 12, wherein the outer frame comprises a bottom surface and a plurality of sidewalls extending from the bottom surface, wherein one of the plurality of sidewalls defines a first receiving groove, and the resilient latches are received in the first receiving groove.

14. The fan frame for a heat dissipation apparatus of claim 13, wherein each resilient latch comprises a main annular body, at least one resilient connecting portion formed on the main annular body and connected to the sidewall, a latch portion for receiving the receiving portion, and a contact portion formed on the main annular body for contacting the actuator mechanism.

15. The fan frame for a heat dissipation apparatus of claim 14, wherein the at least one resilient connecting portion comprises a curved upper connecting portion and a curved lower connecting portion position on opposite ends of the main annular body.

16. The fan frame for a heat dissipation apparatus of claim 12, wherein the inner frame defines a portion receiving groove, and the pair of receiving portions are received in the portion receiving groove.

17. The fan frame for a heat dissipation apparatus of claim 16, wherein the receiving portion comprises a longitudinal main body, a first receiving portion protruding from the main body corresponding to the first latched position, a second receiving portion recessed into the main body corresponding to the second latched position, and a connecting surface connecting the first and second receiving portions.

18. The fan frame for a heat dissipation apparatus of claim 12, wherein the actuator mechanism comprises an operating post slidably mounted in the outer frame, a button end formed on one end of the operating post, a contact end opposite to the button end for contacting the resilient latches, and a pair of resilient reset portions biasing the operating post.

19. The fan frame for a heat dissipation apparatus of claim 18, wherein the outer frame defines an assembly groove in which the resilient reset portion is received in the assembly groove and resists the outer frame.

20. A heat dissipation apparatus comprising:

an outer frame for receiving a plurality of electronic components;

an inner frame sleeved in the outer frame and slidable relative to the outer frame;

a latching mechanism for mechanically securing the inner frame to the outer frame; and a fan mounted to the top of the inner frame;

wherein the latching mechanism comprises at least one resilient latch fixed to the outer frame, at least one receiving portion fixed to the inner frame capable of engaging the corresponding resilient latch in a first latched position and a second latched position, and an actuator mechanism connected to the outer frame and capable of resisting the at least one resilient latch to generate elastic deformation of the resilient latch, thereby unlatching the resilient latch from the corresponding receiving portion.

* * * * *